United States Patent
Fowler et al.

(10) Patent No.: US 6,307,386 B1
(45) Date of Patent: *Oct. 23, 2001

(54) MODULAR MECHANICAL FIXTURING AND AUTOMATED HANDLING OF PRINTED CIRCUIT ASSEMBLIES ON AUTOMATED TEST EQUIPMENT

(75) Inventors: Dwight Fowler; Chris R. Jacobsen, both of Loveland; Jerry G. Tracewell, Berthoud, all of CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,006

(22) Filed: May 29, 1998

(51) Int. Cl.[7] .................................................. G01R 31/02
(52) U.S. Cl. ...................... 324/754; 324/758; 324/158.1
(58) Field of Search .................................. 324/754, 755, 324/758, 158.1, 72.5, 757, 73.1; 414/800, 280

(56) References Cited

U.S. PATENT DOCUMENTS

| | | | |
|---|---|---|---|
| 4,357,575 | * 11/1982 | Uren et al. | 324/758 |
| 4,471,298 | * 9/1984 | Frohlich | 324/72.5 |
| 4,818,933 | * 4/1989 | Kerschner et al. | 324/754 |
| 4,845,843 | * 7/1989 | Babcock | 29/829 |
| 5,094,584 | * 3/1992 | Bullock | 414/800 |
| 5,614,819 | * 3/1997 | Nucci | 324/158.1 |

FOREIGN PATENT DOCUMENTS 2214152A    1/1989   (GB) ............................. B65G/47/48

* cited by examiner

Primary Examiner—Ernest Karlsen
Assistant Examiner—Minh Tang

(57) ABSTRACT

A testing system incorporating a modular primary frame having multiple mounting surfaces and mounted on a conventional probe card testing assembly is disclosed. At least one modular press assembly is attached to the primary frame. The press assembly is height adjustable relative the testing assembly and has a plurality of synchronized force-applying members. At least one conveyor rail pair may be attached to at least one primary frame mounting surface. The rail pair is configured to deliver a printed circuit board to the testing assembly and to withdraw a printed circuit board from the testing assembly. A modular interface assembly comprising a bar code reader, a board marker or other similar devices may be disposed within the primary frame and is height adjustable relative the testing assembly. A modular secondary frame attached to at least one primary frame mounting surface may house the interface.

14 Claims, 10 Drawing Sheets

MODULAR MECHANICAL FIXTURING AND AUTOMATED HANDLING OF PRINTED CIRCUIT ASSEMBLIES ON AUTOMATED TEST EQUIPMENT

FIELD OF THE INVENTION

The present invention relates generally to testing of printed circuit boards for use in electronic products and, specifically, to a press for engaging a printed circuit board to a probe card assembly.

BACKGROUND OF THE INVENTION

After printed circuit boards have been manufactured, and before they can be used or placed into assembled products, they must be tested to verify that all required electrical connections have been properly completed and that all necessary electrical components have been attached or mounted to the board in proper position and with proper orientation.

Other reasons for testing are to determine and verify whether the proper components have been used and whether they are of the proper value. It is also necessary to determine whether each component performs properly (i.e., in accordance with the specification). Some electrical components also may require adjustment after installation.

Most testers utilize a "bed-of-nails" design, which includes a probe surface having plural (thousands) of sockets that are interconnected to test equipment, such as a computer with the appropriate software. Test probes are insertable in these sockets and protrude upwardly from the probe surface. These probes are configured to match the input/output connection points of the electronic components, such as integrated circuits, resident on the printed circuit board (PCB) being tested. Further, the probes are biased upwardly such that, to ensure proper alignment, a card must be placed over the probes and sufficient downward force must be provided to the PCB such that proper electrical connection is made between the inputs/outputs of the electronic components and the test equipment, via the biased test probes.

Fixturing systems have been developed for purposes of handling printed circuit boards for testing. The most common of such fixturing systems is a vacuum fixture. There are many disadvantages associated with vacuum fixturing. In vacuum fixturing, atmospheric pressure acts directly on a PCB with a vacuum beneath it, forcing the board against spring loaded testing probes. Problems arise from the need to maintain a seal around and across the board. Maintaining a vacuum seal in an automated environment is even more troublesome. Warped printed circuit boards are commonly encountered and require a separate effort or effect to push and seat them in the fixture gasketing material. PCBs with holes or apertures generally complicate vacuum fixturing techniques because of the difficulty associated with maintaining a proper seal. Also, probe density is limited by atmospheric pressure. The seals and gasketing required also involve much periodic maintenance, and contaminants and other foreign matter may be aspirated by the fixture due to the vacuum. Furthermore, vacuum fixtures generally do not provide sufficiently forceful contact between the probes and PCBs to displace contaminants present on the board surfaces, thereby necessitating additional costs and chemical disposal issues associated with pre-cleaning the boards before testing.

In response to the aforementioned problems associated with vacuum fixturing systems, other fixturing systems have been developed, including pneumatically powered systems. The typical pneumatic fixturing system incorporates a flat plate attached to a cylinder. Pneumatic pressure is applied to the cylinder which in turn forces the plate against the printed circuit board disposed on the probes. Testing problems arise from the fact that the center of the plate receives the majority of the force applied by the cylinder. Accordingly, the periphery of the board may not sufficiently contact and be tested by the probes. This is especially true with large and/or thin PCBs. Further, such pneumatic systems are not height adjustable relative the probes and thus are unable to accommodate boards of varying thicknesses and/or component heights.

It is conventional practice for humans to manually handle the printed circuit boards for testing, i.e., selecting and delivering the PCBs to a test fixture, loading the PCBs into the tester, interacting with the tester by making any required adjustments, removing the PCBs from the tester, attaching any required repair ticket to the PCB, and sorting the PCBs into pass or fail outputs.

There are, of course, several disadvantages and limitations associated with manual handling and probing of the printed circuit boards. Manual testing is tedious and the speed with which a human can perform this task is limited. Additionally, humans may create costly errors by rejecting an acceptable PCB, by accepting a defective PCB or by inserting a PCB into a test fixture with improper orientation.

In response to the aforementioned problems associated with manual handling of circuit boards, automated processes for handling and testing the PCBs have been developed. Such processes often incorporate robotic and assembly line elements. The primary disadvantage of implementing such an automated process stems from the nature of the machinery necessary for carrying out such a process. For a given set of testing parameters particular to a customer, only a few core equipment elements are necessary. However, as the customer's testing needs change, so do their equipment needs. Presently, there does not exist an efficient and inexpensive means by which the customer can modify the equipment to meet such changing needs; the most cost-effective solution to such a problem is to replace the current equipment with higher capability equipment. Alternatively, the customer with initially modest testing needs may, at the outset, buy equipment including all currently available accessories in anticipation of someday requiring such accessories. However, a customer having minimal or no experience with the core set of equipment may not be comfortable with using such advanced accessories, thereby fostering testing procedure inefficiencies. Additionally, the customer's testing requirements may never ripen into a need for such extra equipment, rendering the initial expenditure unnecessary.

Accordingly, what is needed in the art is a printed circuit board testing system that enables rapid and evenly distributed pressing of the boards to the test probes, allows adjustability of the press height so as to accommodate differently sized boards, and is modifiable to multiple configurations so as to enable multiple modes of operation.

SUMMARY OF THE INVENTION

According to the principles of the present invention, a modular multi-configuration upgradeable testing system for quickly and accurately testing printed circuit boards in conjunction with a conventional probe card testing assembly is disclosed.

In the preferred embodiment of the invention, a testing system is disclosed incorporating a modular primary frame having multiple mounting surfaces and mounted on a conventional probe card testing assembly. At least one modular press assembly is attached to the primary frame. The press assembly is height adjustable relative the testing assembly and has a plurality of synchronized force-applying members. A modular conveyor assembly comprising at least one conveyor rail pair may be attached to at least one primary frame mounting surface. The rail pair is configured to deliver a printed circuit board (PCB) to the testing assembly and to withdraw a printed circuit board from the testing assembly. A modular interface assembly comprising a bar code reader, a PCB marker or other similar devices may be disposed within the primary frame and is height adjustable relative the testing assembly. A modular secondary frame attached to at least one primary frame mounting surface may house the interface. A controller controls and coordinates the testing functions of the testing assembly in addition to controlling and coordinating the delivery and withdrawal functions of the conveyor rail pair and the functions associated with the modular interface assembly.

BRIEF DESCRIPTION OF THE DRAWING

The invention will be better understood from a reading of the following detailed description taken in conjunction with the drawing figures in which like reference designators are used to designate like elements, and in which.

DETAILED DESCRIPTION

Figure 1:
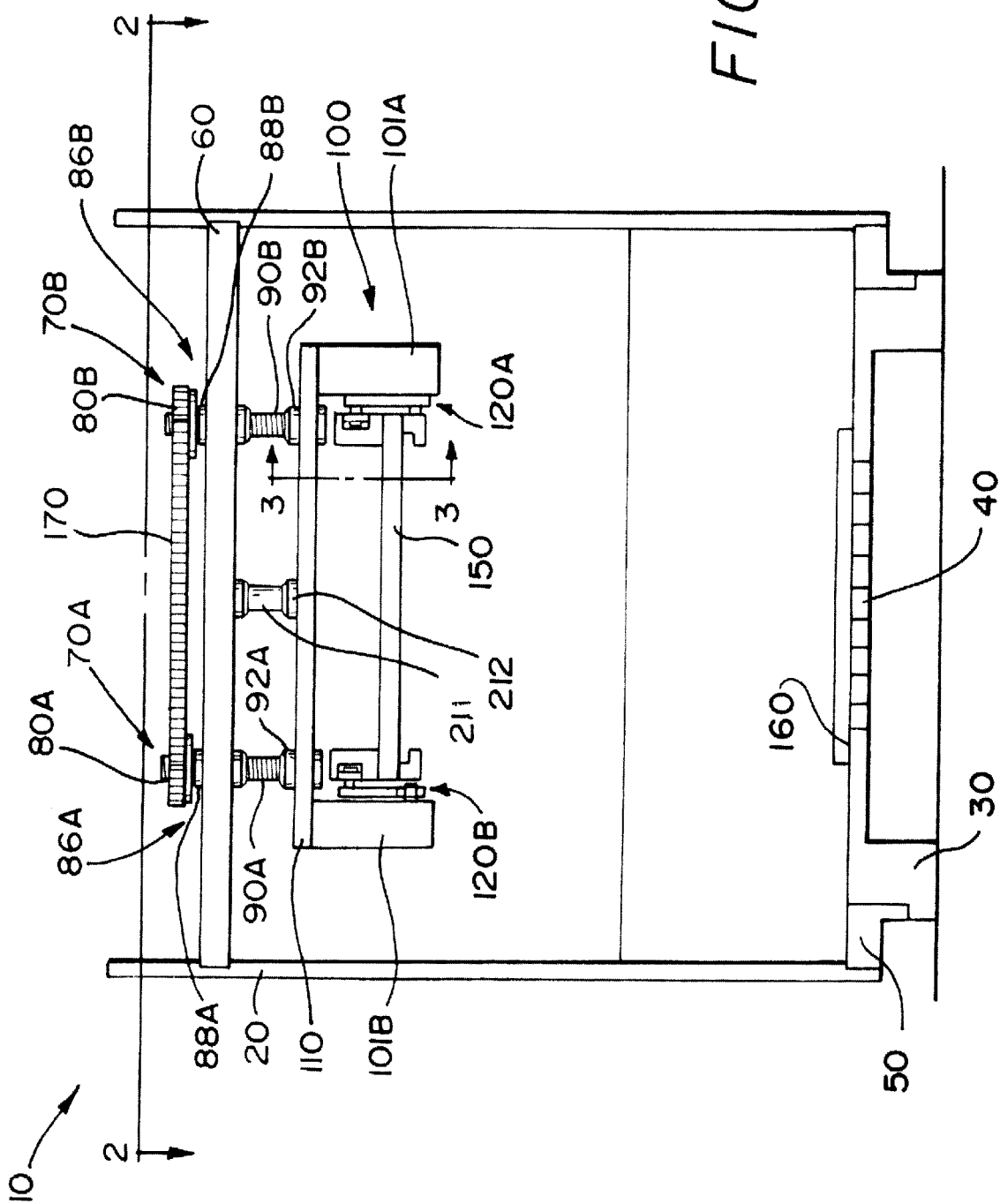
FIG. 1 is a front plan view of the PCB press according to the present invention.

The drawing figures are intended to illustrate the general manner of construction and are not to scale. In the description and in the claims the terms left, right, front and back and the like are used for descriptive purposes. However, it is understood that the embodiment of the invention described herein is capable of operation in other orientations than is shown and the terms so used are only for the purpose of describing relative positions and are interchangeable under appropriate circumstances.

As shown in FIG. 1, a PCB press 10 includes a modular frame 20 having flanges 50, which are attached to a conventional probe card testing assembly 30. Probe card testing assembly 30 includes a conventional probe card 40 used for testing a printed circuit board 160. PCB press 10 comprises press assembly 100, which is a fast-acting press that moves press plate 150 rapidly through a fixed stroke. Press assembly 100 is height adjustable within frame 20 by means of lead screw assemblies 70A, 70B, 70C, and 70D disposed substantially proximal the peripheral corners of press assembly 100. For purposes of clarity, only the details of lead screw assembly 70A are described in detail, however, lead screw assemblies 70B–70D comprise substantially identical elements. Lead screw assembly 70A comprises an upper bearing portion 86A that rotates within but is constrained in the axial direction by bearing journal 88A disposed in press mount 60 of frame 20. Lower portion 90A of lead screw assembly 70A is threaded into a threaded boss 92A in press assembly upper plate 110 such that, when lead screw 70A is rotated, upper plate 110 (and with it press assembly 100) are drawn toward or forced away from press mount 60 of frame 20. Disposed atop lead screw assembly 70 is a driving member 80A, which preferably comprises a gear, chain sprocket, timing belt pulley or similar apparatus for receiving synchronized power transmission.

Figure 2:
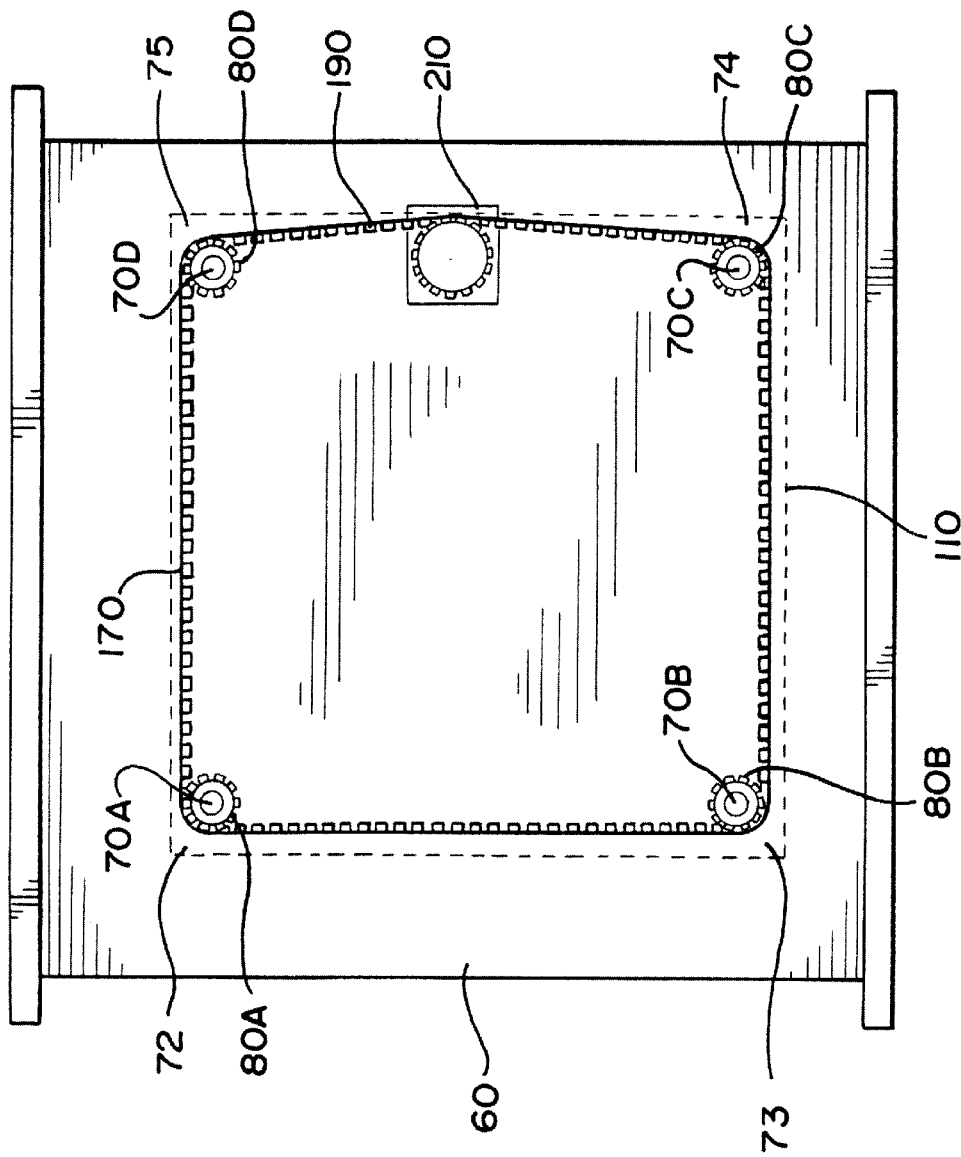
FIG. 2 is a partial top plan view of the PCB press according to the present invention.

With reference to FIGS. 1 and 2, in the illustrative embodiment, four lead screw assemblies 70A–70D are disposed proximal the peripheral corners 72,73,74 75 of press assembly upper plate 110 (shown in dashed lines in FIG. 2). A conventional link-and-roller chain 170 engages driving members 80A–80D in conventional fashion to cause the rotation of all of lead screw assemblies 70A–70D to be synchronized. By synchronizing the rotation of lead screw assemblies 70A–70D, each of which have the identical helical pitch, upper plate 110 can be moved toward or away from press mount 60 of frame 20 while maintaining upper plate 110 in a precisely horizontal attitude. For added stability, stabilizer rail 211 is rigidly mounted in press mount 60 so as to slidingly engage a stabilizer 212 in press assembly upper plate 110. Additional stabilizer rails may be added as required for the particular application. Lead screw assemblies 70A–70D may be manually adjusted or, as shown in FIG. 2, a drive motor 190 may be coupled via sprocket 210 to chain 170 thereby providing a power-adjustment feature. Although a conventional link-and-roller chain is disclosed in the illustrative embodiment, a timing belt, gear train, flexible shafting, or any other conventional means of synchronously driving a plurality of parallel shafts is contemplated within the present invention.

Figure 3:
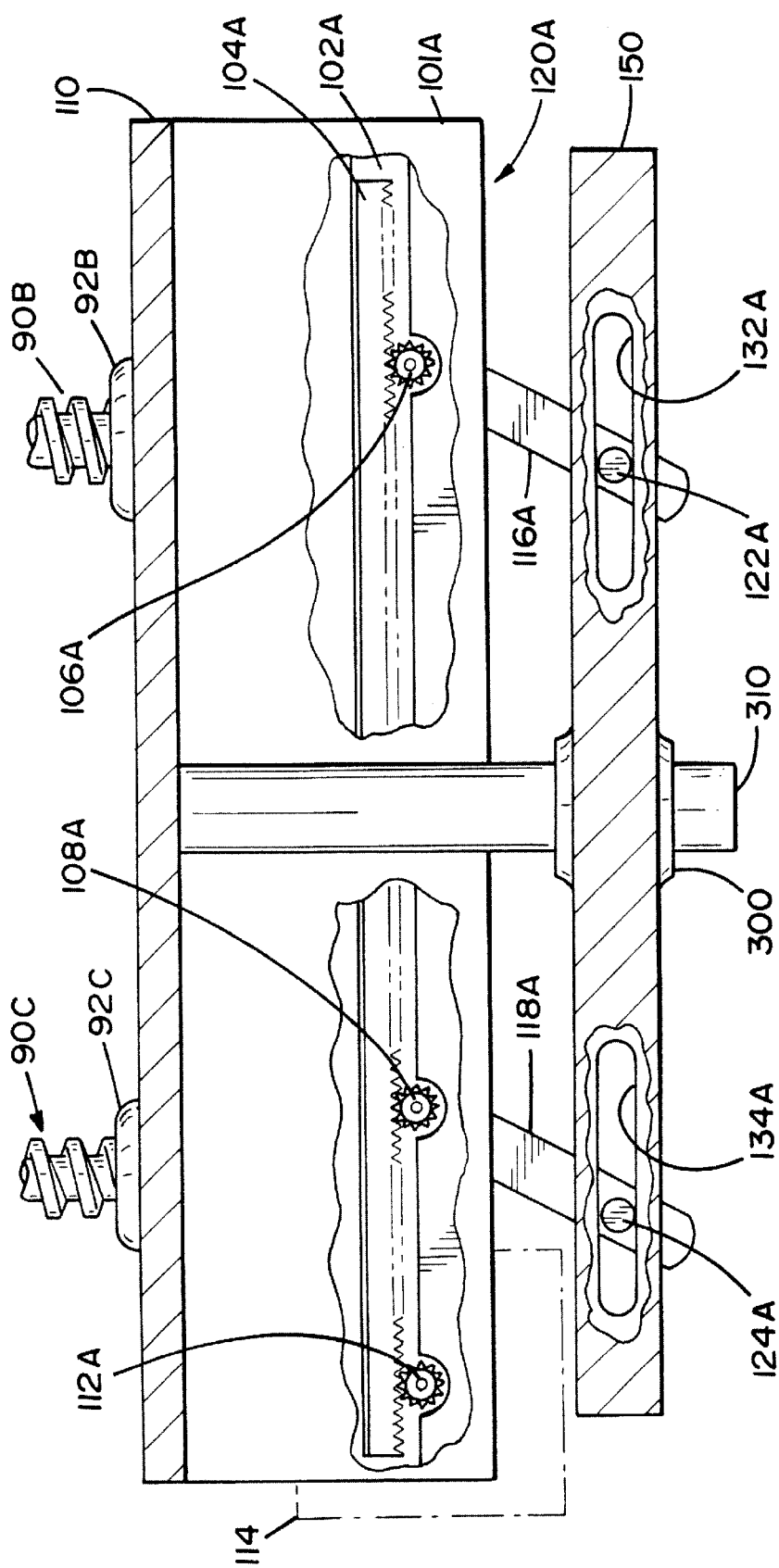
FIG. 3 is a partial cross-section of FIG. 1 along line 3—3.

FIG. 3 is a partial cross-section of FIG. 1 along line 3—3 with the press plate 150 near the fully extended position (press plate 150 is shown fully retracted in FIG. 1). With reference to FIGS. 1 and 3, press assembly 100 comprises side plates 101A and 101B, which are rigidly attached to opposite sides of press assembly upper plate 110. Each of side plates 101A and 101B support substantially equivalent actuator mechanisms 120A (FIG. 3) and 120B (not shown). Accordingly, for the sake of brevity, only the actuator mechanism supported by side plate 101A is discussed in detail herein. Side plate 101A has a channel 102A formed therein. Disposed within channel 102A is a linear gear, also known as a rack, 104A. Rack 104A engages driven pinions 106A and 108A and also engages a drive pinion 112A. Driven pinions 106A and 108A are coupled to bell crank arms 116A and 118A, respectively. Crank pins 122A and 124A, respectively, are disposed transversely in bell crank arms 116A and 118A, respectively, such that the distance from the center of pinion 106A to crank pin 122A is equal to the distance from the center of pinion 108A to crank pin 124A. Crank pin 122A engages a corresponding slot 132A in press plate 150 and crank pin 124A engages a corresponding slot 134A in press plate 150.

In operation, rotary actuator 114 rotates drive pinion 112A, which in turn causes rack 104A to translate along channel 102A. Translation of rack 104A causes pinions 106A and 108A to rotate in unison, which causes bell crank arms 116A and 118A also to rotate in unison, thereby extending press plate 150 downward. Guide rail 300 is rigidly mounted to press assembly upper plate 110 such that it engages a guide bushing 310 in press plate 150. Guide rail 300 thereby constrains press plate 150 to move vertically along guide 300 as bell crank arms 116A and 118A rotate. Because bell crank arms 116A and 118A move in unison, press plate 150 is extended downward with equal downward pressure at both ends.

It should be observed that, unlike linear actuators or ball-screw type presses, the vertical force exerted by bell crank arms 116A and 118A is a function of 1/sin of the angle between bell crank arms 116A and 118A and the horizontal. Since 1/sin approaches infinity as the angle approaches 90 degrees, the vertical force multiplication exerted by bell crank arms 116A and 118A is highest at the beginning and end of the stroke. Thus, the actuator mechanism 120A moves rapidly through most of the stroke yet is able to exert a substantial downward force on the PCB being tested at the end of the stroke, with a modest torque exerted at pinions 106A and 108A. In the illustrative embodiment, the distance between the center of pinions 106A and 108A is two inches. Thus, the total stroke of press plate 150 with bell crank arms 116A and 118A moving through 180 degrees is four inches.

Figure 4:
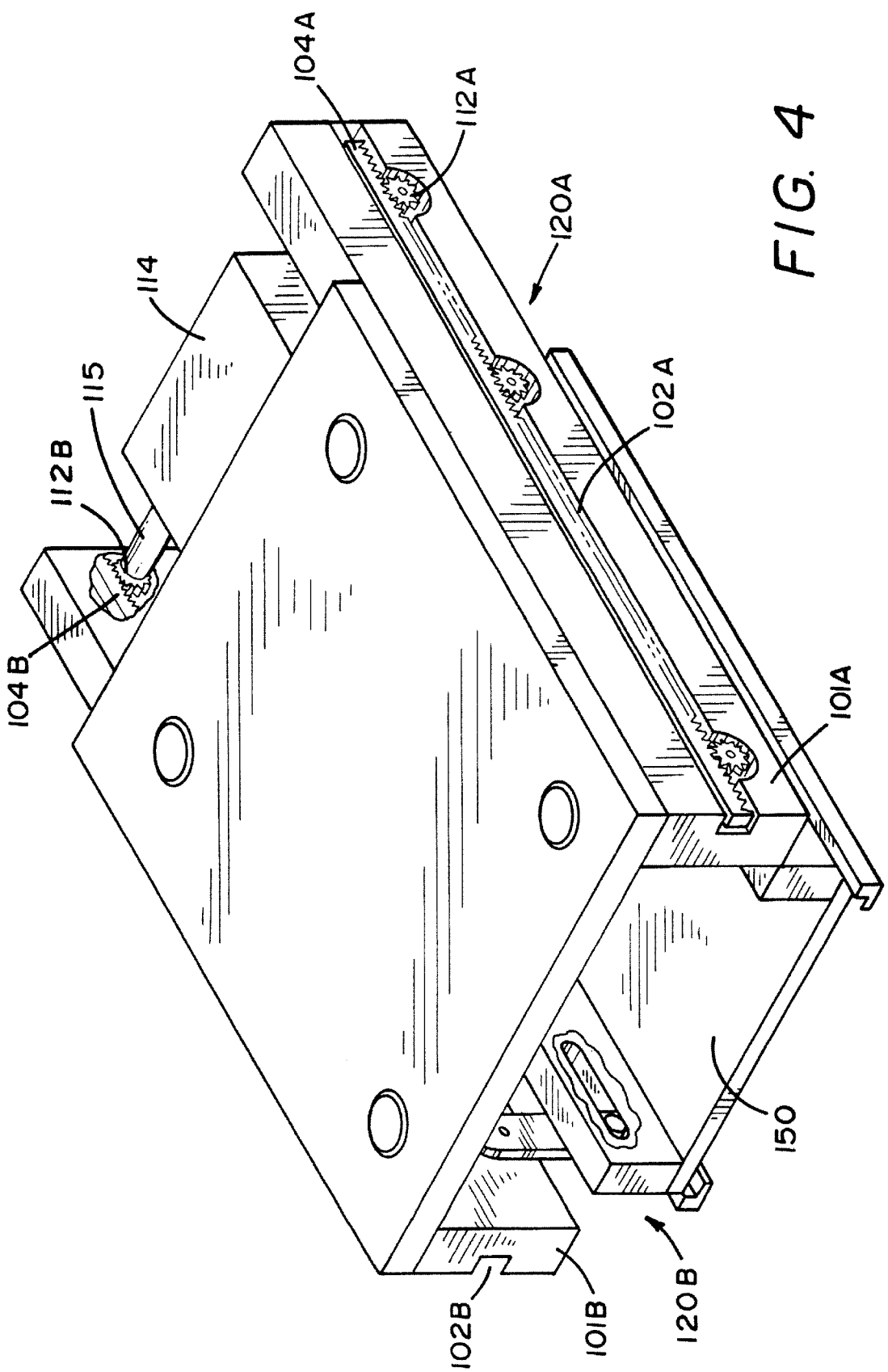
FIG. 4 is an isometric perspective view of the press assembly according to the present invention.

FIG. 4 is an isometric perspective view of press assembly 100. As noted above, side plate 101B supports an actuator mechanism 120B, which is a functionally identical, mirror image of actuator mechanism 120A discussed herein. Preferably, rotary actuator 114 comprises a conventional double-ended actuator having a common shaft 115 that drives both driven pinion 112A of actuator mechanism 120A and a corresponding driven pinion 112B of actuator mechanism 120B. In this way, rack 104A and rack 104B are translated synchronously within corresponding channels 102A and 102B. This in turn ensures that actuator mechanism 120A and 120B are synchronized and, therefore, that equal pressure is applied to all four corners of press plate 150. Rotary actuator may 114 may be electrically or vacuum operated, but is preferably a conventional pneumatic rotary actuator.

Figure 5:
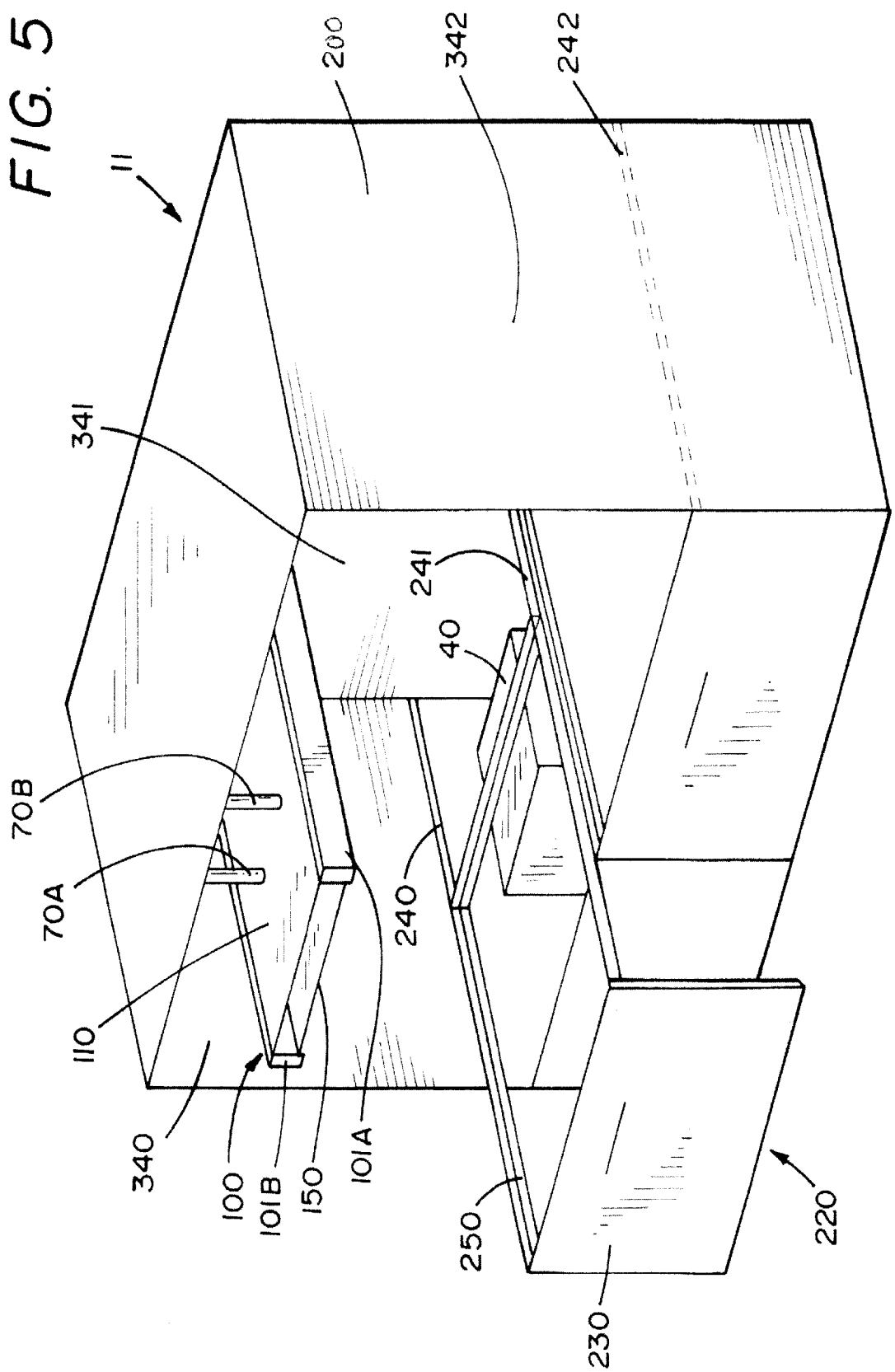
FIG. 5 is a perspective view of a dual bay embodiment of a PCB press according to the present invention.

As seen in FIG. 5, dual bay PCB press 11 is shown with press assembly 100 disposed modular frame 200, which comprises a dual-bay version of frame 20 including removable panels 340, 341 and 342. Any of panels 340, 341, 342 and 343 may be removed to facilitate automated conveyor rail operation as is more fully described hereinafter. Also shown is an optional shuttle system 220 enabling mechanical placement of circuit board 160 upon testing assembly 30. Shuttle system 220 consists of at least one drawer 230 and a drawer support that may take the form of a set of rails 240, 241 and 242. Rails 240, 241 and 242 allow drawer 230 to move in and out of frame 20 and to be placed in a position below press assembly 100 for circuit board 160 testing. Movement of drawer 230 in an out of frame 20 may be manually or automatically produced. Drawer 230 has a substantially open bottom surface 250 that simultaneously supports a circuit board 160 placed thereon and enables interfacing forced by press plate 150 between circuit board 160 and probe card 40. Shuttle system 220 protects the fragile probe card assembly by providing a bed into which the operator places the PCB remote from the probe card assembly and thus enables precise regulation of the extent to which the PCB contacts the probe card assembly.

Figure 6:
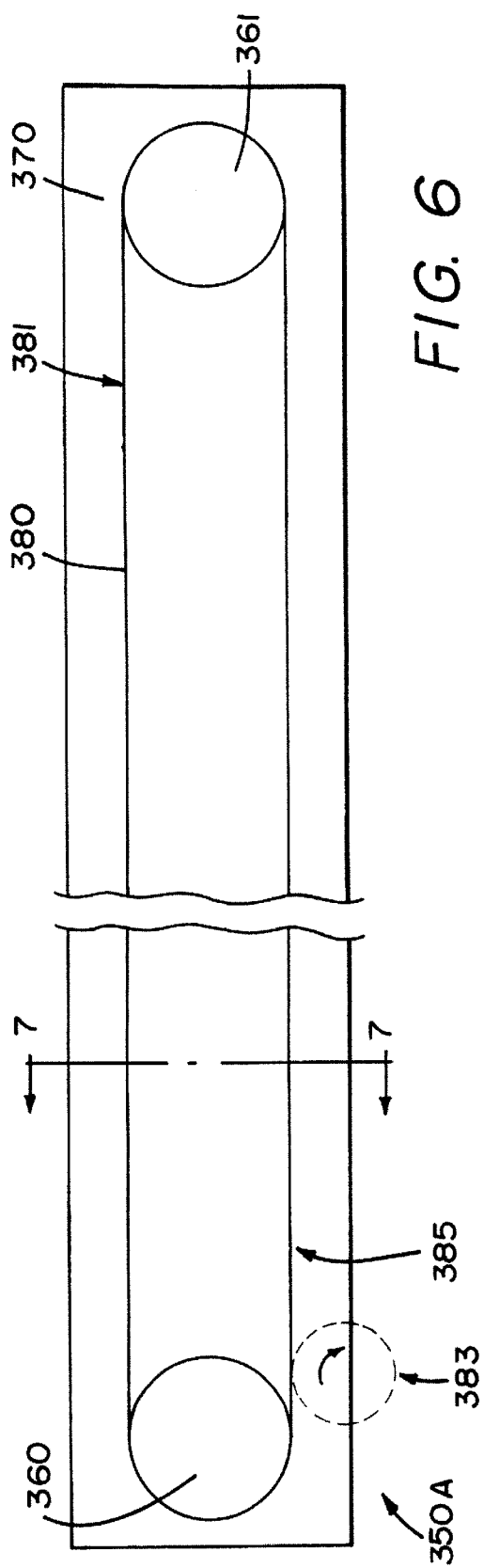
FIG. 6 is a side plan view of a modular conveyor rail according to the present invention.

In FIG. 6, shown is a modular conveyor rail 350A which, when combined with similarly constructed elements, may be employed to convey PCBs to PCB press 10 or PCB press 11 to facilitate automated PCB testing. Conveyor rail 350A includes drive wheels 360 and 361, each of which is bi-directionally rotatably mounted on rail frame 370 at opposite ends of conveyor rail 350A. A continuous conveyor belt 380 having a substantially flat outer surface 381 is stretched between and engaged by drive wheels 360 and 361 such that rotation of wheels 360 and 361 causes corresponding rotation of conveyor belt 380. Belt 380 is caused to move by incorporating a motor to drive at least one of wheels 360 and 361 or by use of a driven snubbing roller 383 that engages the underside 385 of belt 380. Alternatively, belt 380 may be self-propelled by incorporating a drive motor into frame 370 itself. When necessary, successive conveyor rails may be placed in series in order to transport the PCBs a relatively large distance.

Figure 7:
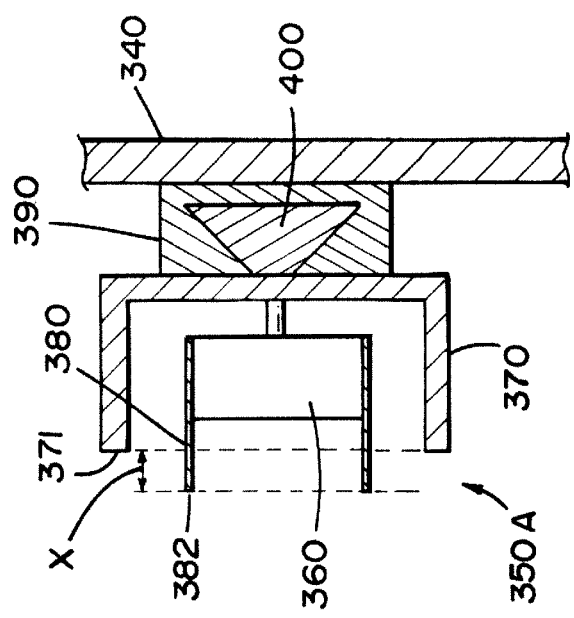
FIG. 7 is a cross-section of FIG. 6 along line 7—7.

FIG. 7 is a cross-section of FIG. 6 taken along line 7—7 and shows an illustrative means of attaching modular conveyor rail 350A to any one of panels 340, 341, 342 or 343. Rail frame 370 incorporates a dovetail fixture 400 that is slidably and securely engaged by dovetail groove 390. Dovetail groove 390 is attached to panel 340 by screws, welds or any of a number of other fastening means known in the art. Belt 380 extends beyond innermost edge 371 of rail frame 370 by a clearance distance X to form a lip 382 on which a PCB may ride as disclosed hereinafter. Preferably, X is equal to three millimeters but may vary depending on PCB specifications and system tolerances.

Figure 8:
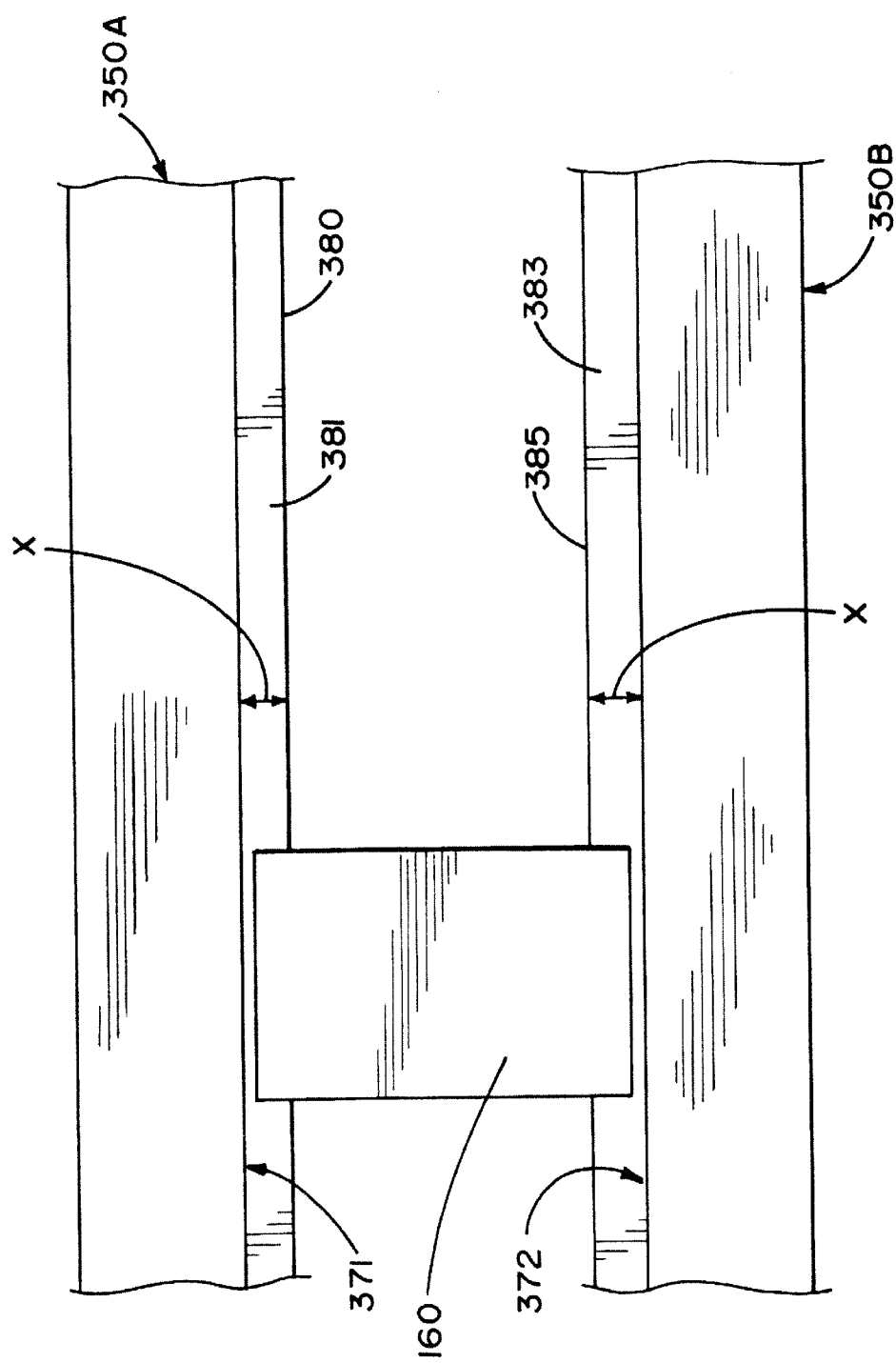
FIG. 8 is a top view of a modular conveyor rail assembly according to the present invention.

FIG. 8 shows a PCB 160 being transported by cooperating conveyor rails 350A and 350B. As can be seen, the outer surfaces 381 and 383 of conveyor belts 380 and 385 support and contact only opposing edges of PCB 160 thereby leaving circuitry disposed along the bottom of PCB 160 exposed for testing.

Figure 9:
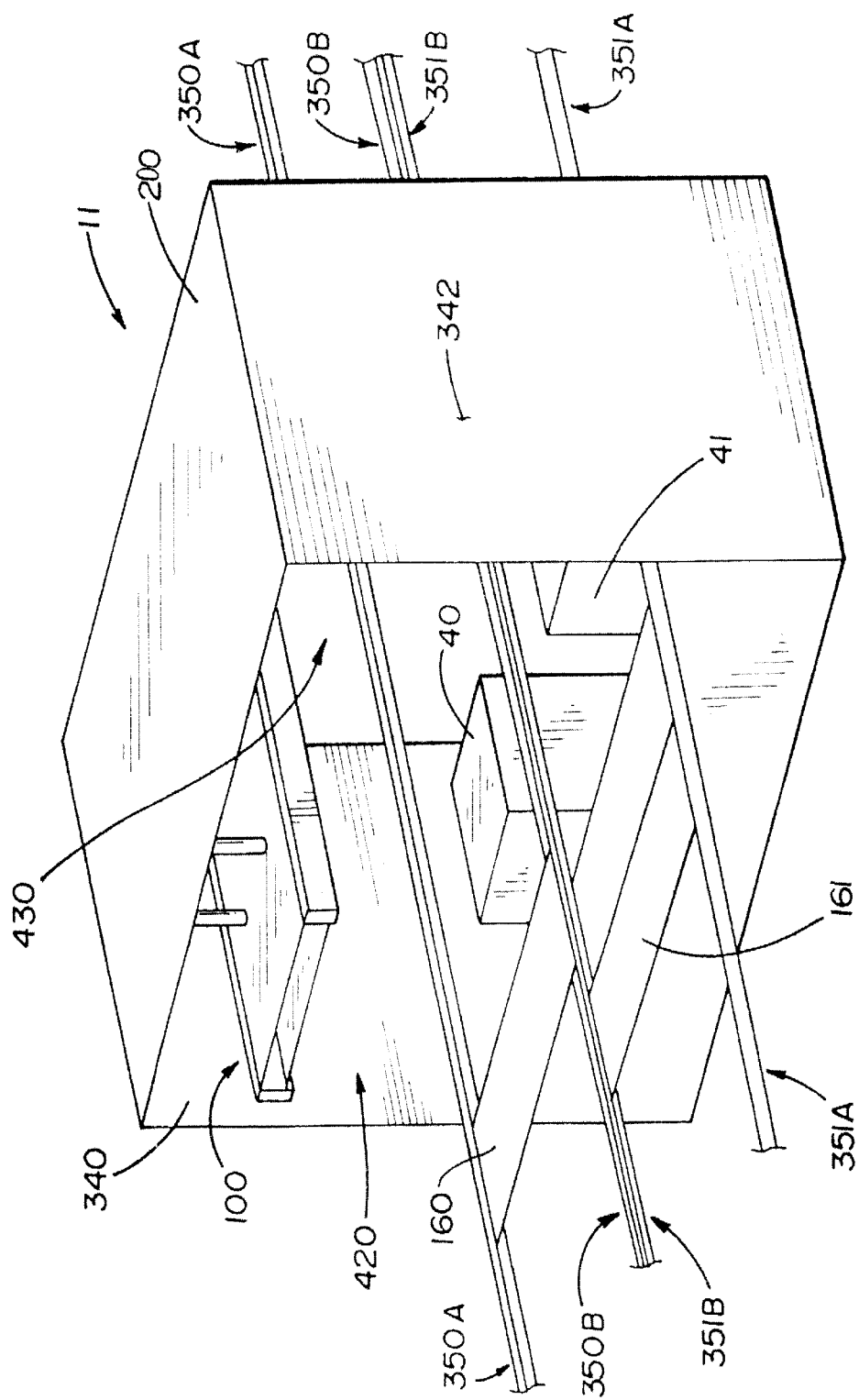
FIG. 9 is a perspective view analogous to that of FIG. 5 incorporating a modular rail assembly in a front-to-back configuration according to the present invention.

FIG. 9 is a perspective view of dual bay PCB press 11 configured in front-to-back configuration. As illustrated, removable panels 341 and 343 have been removed from modular frame 200 while removable panels 340 and 342 have been attached thereto. In this configuration, dual bay automated PCB testing may be conducted through the installation and use of functionally identical modular conveyor rail pair 350 comprising conveyor rails 350A and 350B and conveyor rail pair 351 comprising conveyor rails 351A and 351B. Conveyor rail 350A is attached to panel 340 and conveyor rail 351A is attached to panel 342 in the manner illustrated in FIG. 7. Conveyor rails 350B and 351B are attached to and supported by a conventional support means (not shown) disposed within press 11 such that rail pairs 350 and 351 are cooperatively configured as illustrated in FIG. 8.

Conveyor rail pair 350 transports PCB 160 through press entry 420 and to a testing position above probe card 40 and below press assembly 100 where PCB 160 is tested. While PCB 160 is being tested, rail pair 351 may stage PCB 161 by transporting PCB 161 through press entry 420 and to a testing position above probe card 41 and below a second press assembly (not shown). Once PCB 160 has been tested, PCB 161 is then tested while rail pair 350 simultaneously transports PCB 160 out of press 11 through press exit 430 and stages a successive PCB above probe card 40 and below press assembly 100. Alternatively, rail pairs 350 and 351 may transport PCBs through press entry 420 into press 11 where the PCBs are staged and pressed and subsequently transport the tested PCBs out of press 11 through press entry 420.

Figure 10:
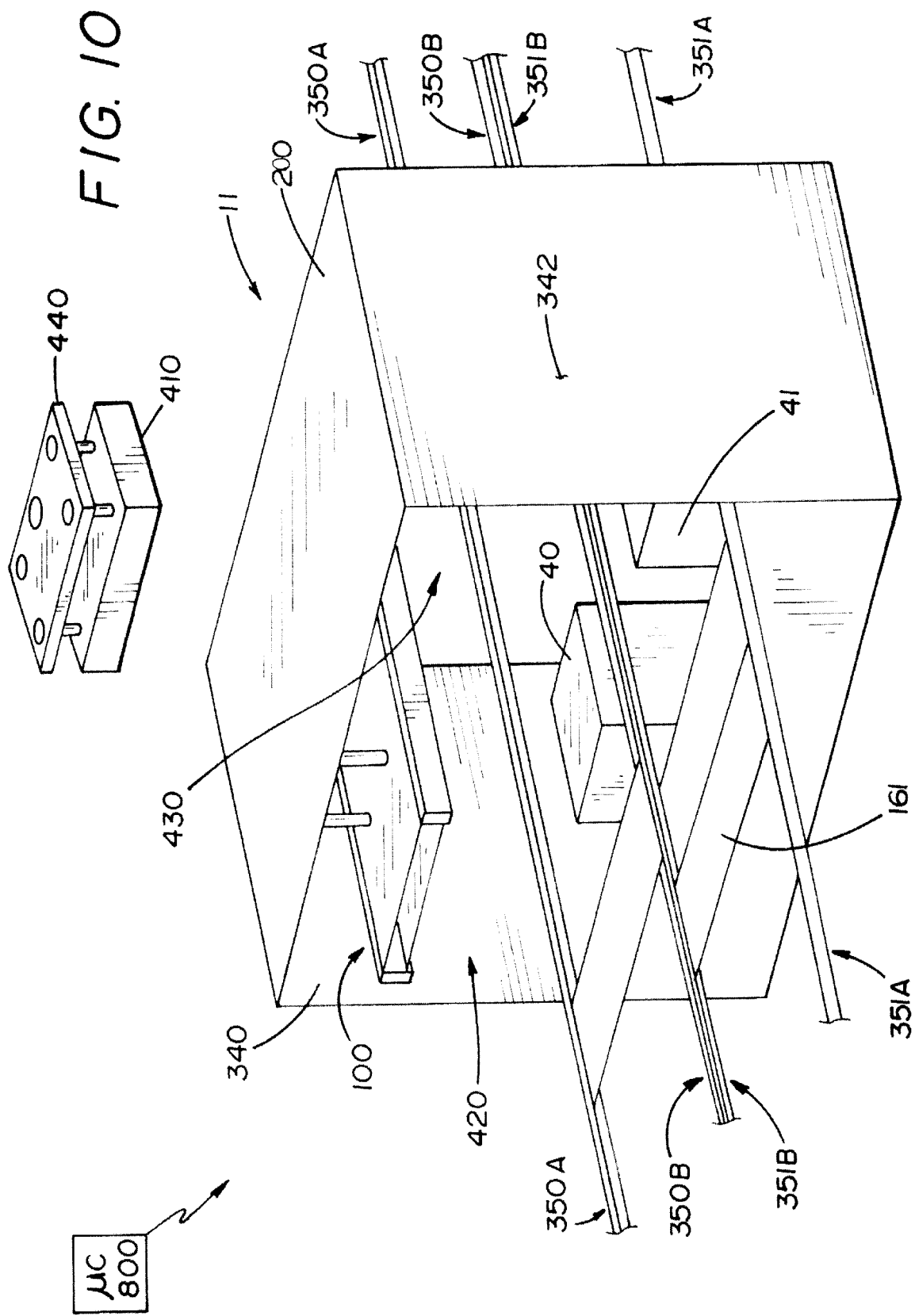
FIG. 10 is a partially exploded perspective view analogous to that of FIG. 9 including an externally mounted modular interface assembly according to the present invention.

FIG. 10 shows the invention as illustrated in FIG. 9 further incorporating a modular secondary frame 440 disposed above rail pair 350 and attached by conventional means to modular frame 200 exterior of press 11. A modular interface assembly 410 is attached to and height adjustable within frame 440 by means of structure functionally identical and structurally similar to that associated with press assembly 100 and press mount 60. Accordingly, once PCB 160 has been tested and transported through press exit 430, other functions may be performed on PCB 160 by bar code scanners, board markers or other devices incorporated by interface assembly 410. Alternatively, secondary frame 440 and interface assembly 410 may also be disposed within an enlarged press frame, essentially the same width and twice as deep as press 11, without loss of optimal functional capabilities.

Figure 11:
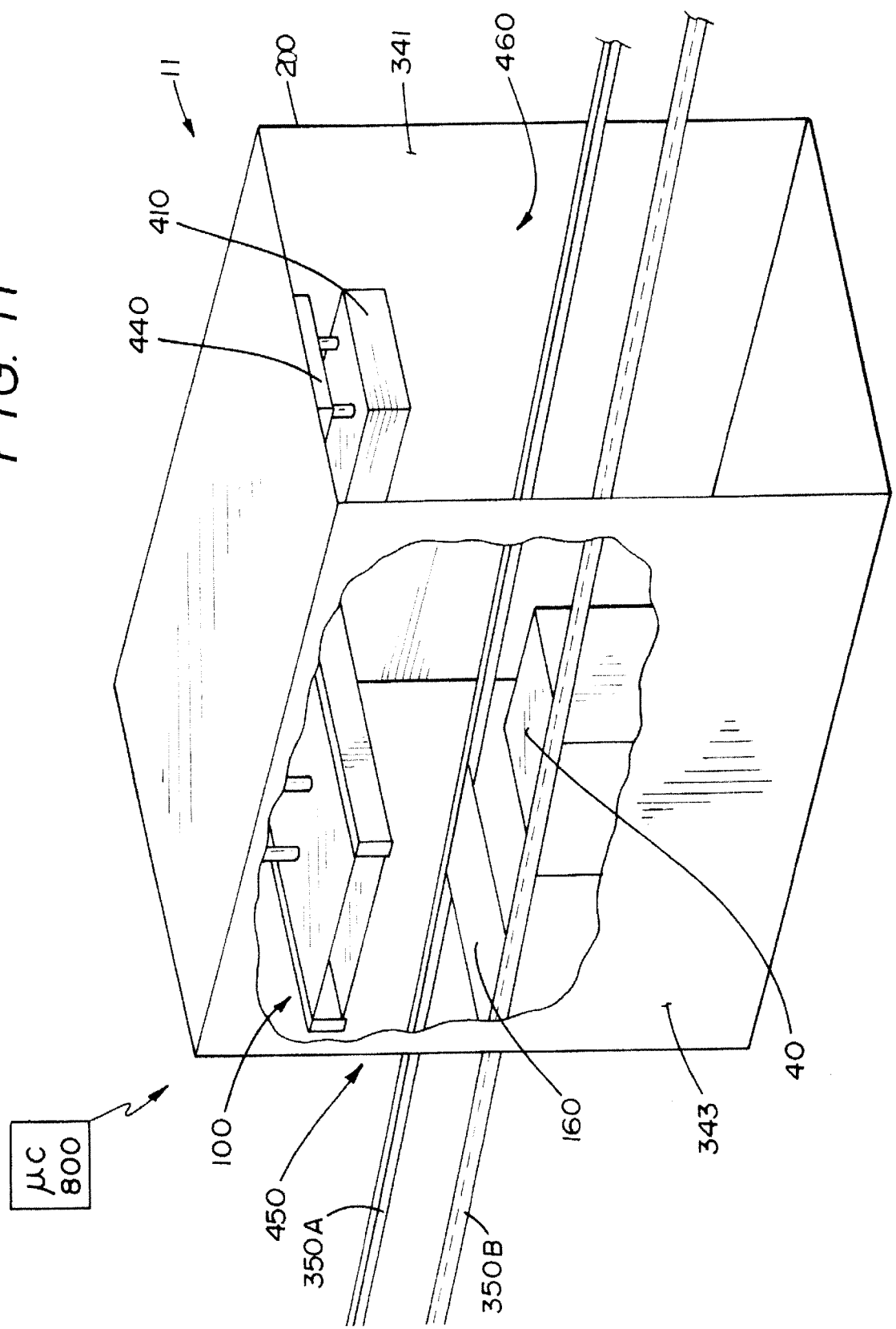
FIG. 11 is a cutaway perspective view of the PCB press incorporating a modular rail assembly in an in-line configuration according to the present invention.

FIG. 11 is a cutaway perspective view of PCB press 11 configured in an in-line configuration, which allows transport of PCBs into and out of the press 11 along a directional plane that is orthogonal to the front-to-back configuration shown in FIG. 9. As illustrated, removable panels 341 and 343 have been attached to modular frame 200 while removable panels 340 and 342 have been removed therefrom. In such a configuration, automated PCB testing of lower capacity and complexity than that illustrated in FIGS. 9 and 10 may be conducted through the installation and use of modular conveyor rail pair 350 comprised of conveyor rail 350A attached to panel 341 and conveyor rail 350B attached to panel 343. Conveyor rail 350 transports PCB 160 through press entry 450 to a testing position above probe card 40 and below press assembly 100 where PCB 160 is tested. After PCB 160 is tested, rail pair 350 transports PCB 160 out of press 11 through press exit 460. Modular secondary frame 440 and modular interface assembly 410 are disposed within press 11 and above a portion of rail pair 350 to enable scanning, marking or other operations to be performed on PCB 160 while present within press 11. Alternatively, secondary frame 440 and interface assembly 410 may also be disposed exterior of press 11 without loss of optimal functional capabilities.

It should be noted that, in conjunction with each configuration described above, a single controller mechanism such as microcontroller 800 may be employed to coordinate the discrete functions of each invention component.

Although the invention has been described in terms of the illustrative embodiment, it will be appreciated by those skilled in the art that various changes and modifications may be made to the illustrative embodiment without departing from the spirit or scope of the invention. It is intended that the scope of the invention not be limited in any way to the illustrative embodiment shown and described but that the invention be limited only by the claims appended hereto.

What is claimed is:

1. A modular multi-configuration upgradeable printed circuit board testing system having modular component parts, said system for use in conjunction with a conventional probe card testing assembly, the system comprising:

a modular primary frame mounted on the testing assembly, said modular primary frame being configurable to allow entry and exit of at least one printed circuit board (PCB) along at least one of a plurality of different directional planes; and at least one modular press assembly mounted in said modular primary frame.

2. The system in accordance with claim 1 wherein said press assembly is height adjustable relative the testing assembly, said press assembly having a plurality of synchronized force-applying members.

3. The system in accordance with claim 1, comprising:

a first modular conveyor assembly attachable to said modular primary frame, said first modular conveyor assembly being configured to deliver a printed circuit board to the testing assembly along at least one of said plurality of different directional planes.

4. The system in accordance with claim 1, comprising:

a second modular conveyor assembly attachable to said modular primary frame, said second modular conveyor assembly being configured to withdraw a printed circuit board from the testing assembly along at least one of said plurality of different directional planes.

5. The system in accordance with claim 3 or 4 wherein said first or second modular conveyor assembly comprises at least one conveyor rail pair.

6. The system in accordance with claim 1 comprising:

a modular interface assembly disposed within said primary frame, said interface assembly being height adjustable relative the testing assembly.

7. The system in accordance with claim 6 wherein said interface assembly comprises at least one bar code reader.

8. The system in accordance with claim 6 wherein said interface assembly comprises at least one board marking device.

9. A modular multi-configuration upgradeable printed circuit board testing system having modular component parts, said system for use in conjunction with a conventional probe card testing assembly, the system comprising:

a modular primary frame mounted on the testing assembly, said modular primary frame being configurable to allow entry and exit of at least one printed circuit board (PCB) along at least one of a plurality of different directional planes;

at least one modular press assembly attachable to said modular primary frame, said modular press assembly being height adjustable relative the testing assembly, said modular press assembly having a plurality of synchronized force-applying members;

at least one conveyor rail pair attachable to at least one primary frame mounting surface, said rail pair being configured to deliver a printed circuit board to the testing assembly; and a modular interface assembly disposed within said modular primary frame, said interface assembly being height adjustable relative the testing assembly, said interface assembly comprising at least one bar code reader and at least one board marking device.

10. A method of customized testing of printed circuit boards in conjunction with a conventional probe card testing assembly, the method comprising the steps of:

mounting a modular primary frame mounted on the testing assembly, said modular primary frame being configurable to allow entry and exit of at least one printed circuit board (PCB) along at least one of a plurality of different directional planes;

mounting a modular press assembly to said modular primary frame;

causing a printed circuit board to be placed in testing position upon the testing assembly; and actuating said modular press assembly thereby causing the circuit board to be pressed and tested.

11. A method in accordance with claim 10 wherein said press assembly is height adjustable relative the testing assembly, said press assembly having a plurality of synchronized force-applying members.

12. A method in accordance with claim 10 comprising the steps of:

attaching at least one additional modular press assembly to said primary frame;

causing at least one additional printed circuit board to be placed in testing position upon the testing assembly; and actuating said additional modular press assembly thereby causing the additional circuit board to be pressed and tested.

13. A method in accordance with claim 10 comprising the step of:

attaching a modular conveyor assembly to at least one primary frame mounting surface, said conveyor being configured to deliver a printed circuit board to the testing assembly, said conveyor being the means by which the circuit board is caused to be placed in testing position.

14. A method in accordance with claim 10 comprising the step of:

disposing a modular interface assembly within said primary frame, said interface assembly being height adjustable relative the testing assembly, said interface assembly comprising at least one bar code reader and at least one board marking device.

* * * * *